(12) United States Patent
Cho

(10) Patent No.: US 9,935,263 B2
(45) Date of Patent: Apr. 3, 2018

(54) ELECTRONIC DEVICE

(71) Applicant: SK hynix Inc., Icheon (KR)

(72) Inventor: Kwang-Hee Cho, Icheon (KR)

(73) Assignee: SK HYNIX INC., Icheon (KR)

( * ) Notice: Subject to any disclaimer, the term of this patent is extended or adjusted under 35 U.S.C. 154(b) by 262 days.

(21) Appl. No.: 14/613,241

(22) Filed: Feb. 3, 2015

(65) Prior Publication Data

US 2016/0064659 A1     Mar. 3, 2016

(30) Foreign Application Priority Data

Sep. 2, 2014  (KR) .......................... 10-2014-0116144

(51) Int. Cl.
| | | |
|---|---|---|
| *H01L 45/00* | (2006.01) | |
| *H01L 27/24* | (2006.01) | |
| *G06F 3/06* | (2006.01) | |
| *H01L 27/22* | (2006.01) | |

(52) U.S. Cl.
CPC .............. *H01L 45/08* (2013.01); *G06F 3/061* (2013.01); *G06F 3/0604* (2013.01); *G06F 3/0659* (2013.01); *G06F 3/0685* (2013.01); *H01L 27/224* (2013.01); *H01L 27/2409* (2013.01); *H01L 27/2427* (2013.01); *H01L 45/06* (2013.01); *H01L 45/1233* (2013.01); *H01L 45/141* (2013.01); *H01L 45/146* (2013.01); *H01L 45/147* (2013.01)

(58) Field of Classification Search
CPC .......... G06F 12/00; G06F 12/08; G06F 13/00; G06F 3/06; G06F 3/0604; G06F 3/061; G06F 3/0659; G06F 3/0685
USPC .................................. 711/100, 113, 154, 200
See application file for complete search history.

(56) References Cited

U.S. PATENT DOCUMENTS

2011/0037046 A1*  2/2011  Sato ...................... H01L 45/124
                                                                   257/4

FOREIGN PATENT DOCUMENTS

| KR | 10-2013-0036279 A | 4/2013 |
| WO | WO 2011/159582 A2 | 12/2011 |

* cited by examiner

*Primary Examiner* — Long Pham

(57) ABSTRACT

An electronic device includes a semiconductor memory. The semiconductor memory includes a selection element layer; a material layer directly coupled to a first surface of the selection element layer and including a conductive filament; and a variable resistance layer coupled to a second surface of the selection element layer opposite to the first surface.

20 Claims, 9 Drawing Sheets

ELECTRONIC DEVICE

CROSS-REFERENCE TO RELATED APPLICATION

The present application claims priority to Korean Patent Application No. 10-2014-0116144, entitled "ELECTRONIC DEVICE" and filed on Sep. 2, 2014, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can reduce an operating power.

In an embodiment, an electronic device includes a semiconductor memory unit that comprises a stack structure including a selection element layer and a material layer which is directly coupled to a first surface of the selection element layer and includes a conductive filament; and a variable resistance layer coupled to the stack structure.

Embodiments of the above device may include one or more of the following.

The variable resistance layer is coupled to a second surface of the selection element layer opposite to the first surface. The material layer has a variable resistance characteristic. The material layer includes a metal oxide, and the metal oxide includes oxygen vacancies so that the conductive filament is generated depending on movement of the oxygen vacancies in the metal oxide. The variable resistance layer and the material layer include a metal oxide, and a thickness of the variable resistance layer is larger than that of the material layer. The variable resistance layer and the material layer include a metal oxide, and a density of oxygen vacancies in the variable resistance layer is lower than that of the material layer. The material layer has an insulating characteristic. A part of the material layer is in a dielectric breakdown state so that the conductive filament is generated at the part of the material layer. The selection element layer switches between a conductive state and an insulation state depending on Joule heating induced by a voltage or current applied thereto. The conductive filament is generated in an initial operation of the semiconductor memory unit and remains in the material layer during operations of the selection element layer and the variable resistance layer that are performed after the initial operation In another embodiment, an electronic device includes a semiconductor memory unit that comprises a selection element layer; a first variable resistance layer directly coupled to a first surface of the selection element layer; and a second variable resistance layer coupled to a second surface of the selection element layer opposite to the first surface, wherein an absolute value of a forming voltage of the first variable resistance layer is smaller than an absolute value of an operating voltage of the second variable resistance layer.

Embodiments of the above device may include one or more of the following.

The absolute value of the forming voltage of the first variable resistance layer is smaller than an absolute value of a turn-on voltage of the selection element layer. The absolute value of the turn-on voltage of the selection element layer is smaller than the absolute value of the operating voltage of the second variable resistance layer. During a forming operation of the first variable resistance layer, an operation of the selection element layer and an operation of the second variable resistance layer are not performed. During a forming operation of the first variable resistance layer, a conductive filament is generated in a portion of the first variable resistance layer. The conductive filament remains in the first variable resistance layer during an operation of the selection element layer and an operation of the second variable resistance layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

These and other aspects, implementations and associated advantages are described will become apparent in view of the drawings and the description of embodiments provided herein, which are intended to provide further explanation of the invention as claimed.

DETAILED DESCRIPTION

Figure 1:
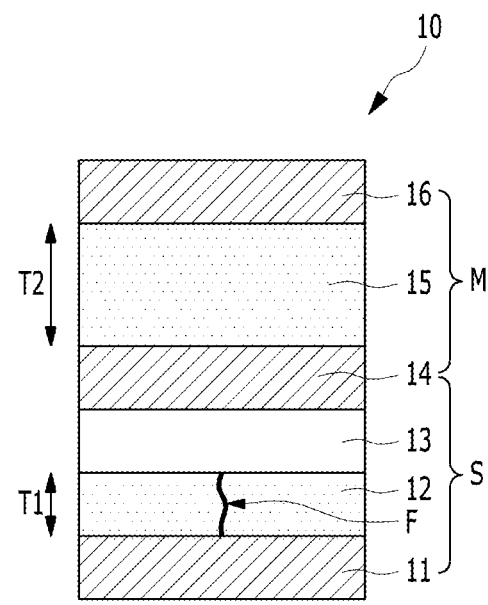
FIG. 1 is a cross-sectional view illustrating a memory cell in accordance with an implementation.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

Figure 2A:
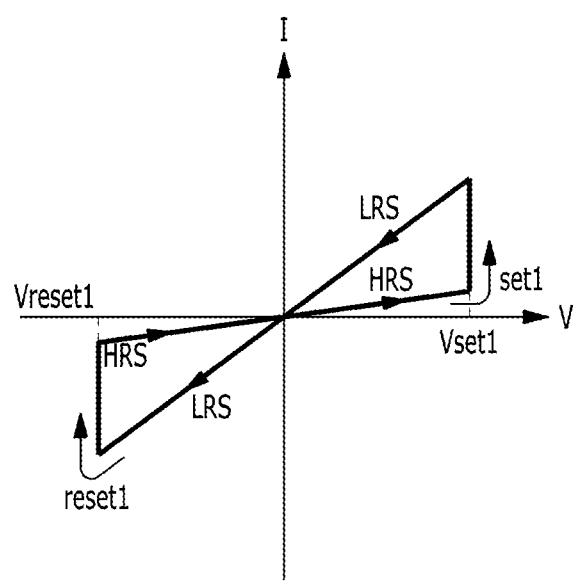
FIG. 2A is a graph illustrating a current-voltage characteristic of a first variable resistance layer of FIG. 1.
Figure 2B:
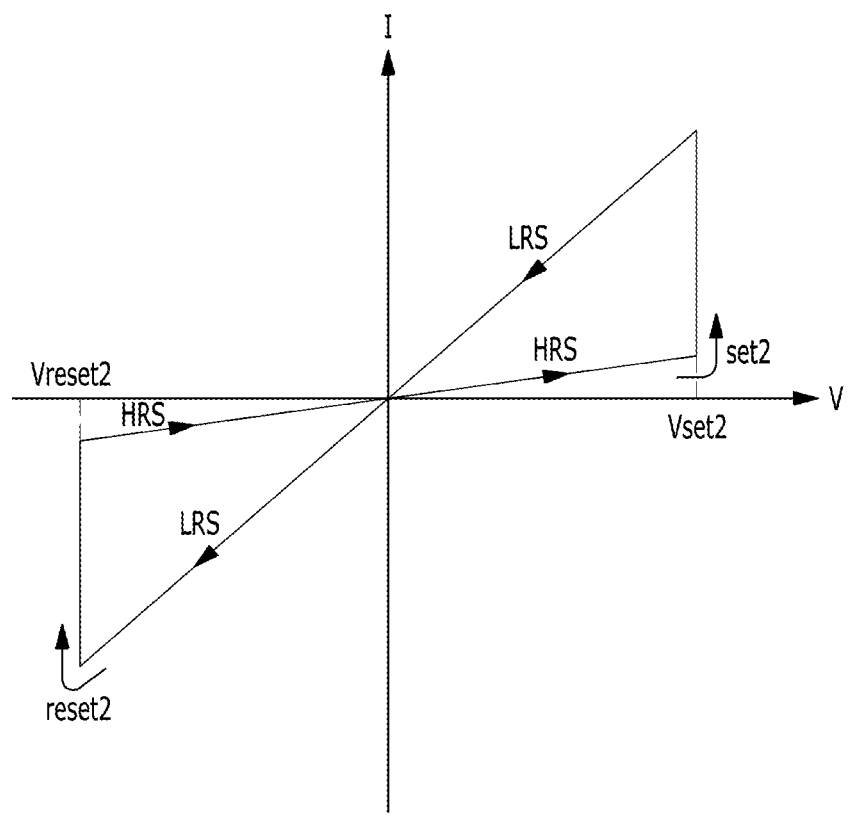
FIG. 2B is a graph illustrating a current-voltage characteristic of a second variable resistance layer of FIG. 1.
Figure 2C:
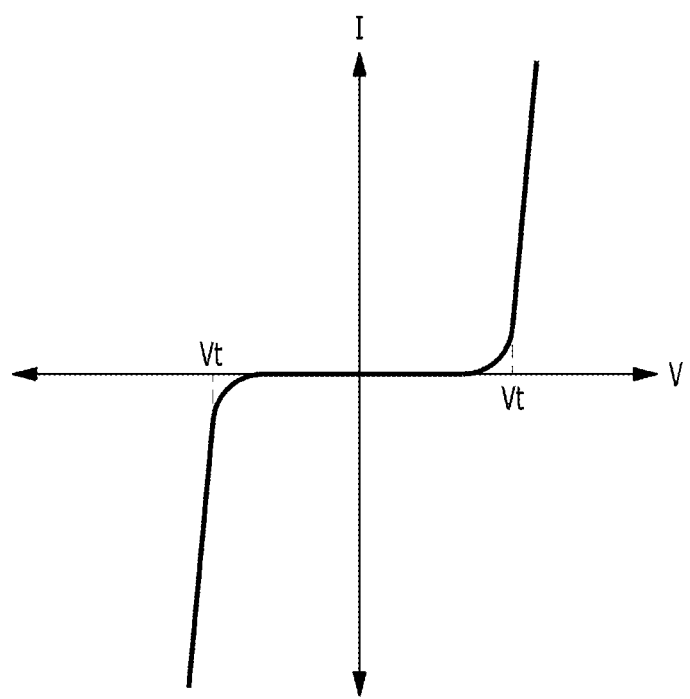
FIG. 2C is a graph illustrating a current-voltage characteristic of a selection element layer of FIG. 1.
Figure 2D:
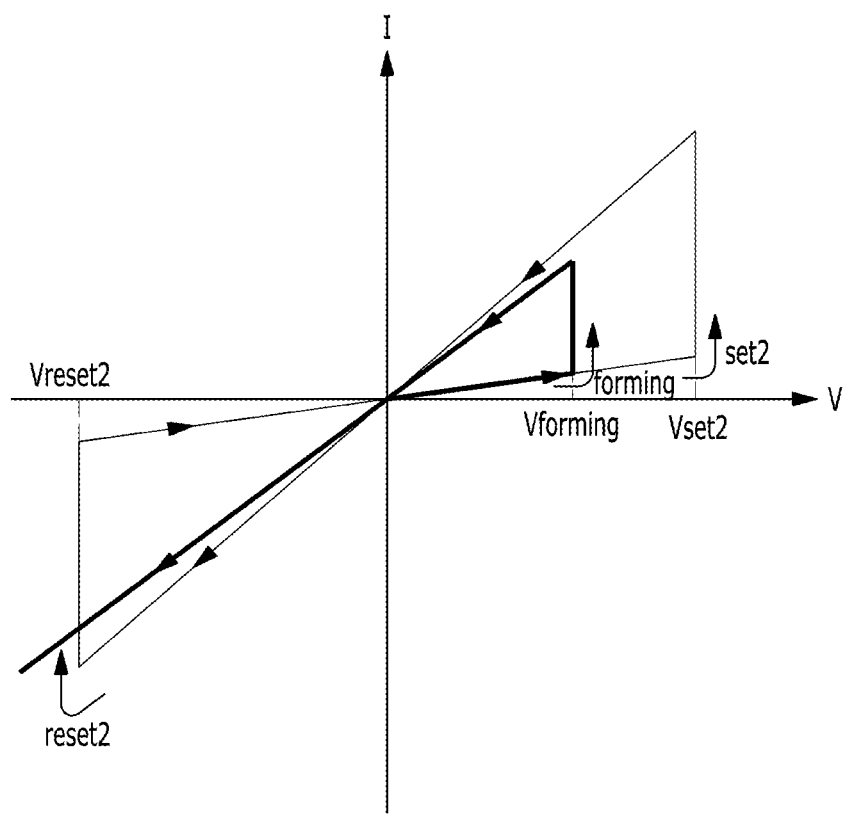
FIG. 2D is a graph illustrating a current-voltage characteristic of each of the first variable resistance layer and the second variable resistance layer in the memory cell of FIG. 1.

FIG. 1 is a cross-sectional view illustrating a memory cell in accordance with an implementation, FIG. 2A is a graph illustrating a current-voltage characteristic of a first variable resistance layer of FIG. 1, FIG. 2B is a graph illustrating a current-voltage characteristic of a second variable resistance layer of FIG. 1, FIG. 2C is a graph illustrating a current-voltage characteristic of a selection element layer of FIG. 1, and FIG. 2D is a graph illustrating a current-voltage characteristic of each of the first variable resistance layer and the second variable resistance layer in the memory cell of FIG. 1.

Referring to FIG. 1, a memory cell 10 may include a first electrode 11, a second electrode 14, a third electrode 16, a stack structure of a first variable resistance layer 12 and a selection element layer 13, and a second variable resistance layer 15 interposed between the second electrode 14 and the third electrode 16. The stack structure is interposed between the first electrode 11 and the second electrode 14. In this implementation, the first variable resistance layer 12 is located at a lower portion of the stack structure and the selection element layer 13 is located at an upper portion of the stack structure so that the selection element layer 13 is closer to the second variable resistance layer 15 compared to the first variable resistance layer 12, and vice versa. That is, in another implementation, the first variable resistance layer 12 is located at an upper portion of the stack structure and the selection element layer 13 is located at a lower portion of the stack structure. The first electrode 11, the second electrode 14, and the third electrode 16 may be formed of one or more conductive materials, e.g., a metal such as W, Al, Ti, etc., a metal nitride such as TiN, etc., a semiconductor material doped with an impurity, or a combination thereof. The first electrode 11 and the third electrode 16 may be located at both ends of the memory cell 10 to receive a current or voltage. The first electrode 11 and the third electrode 16 may have various shapes, e.g., a line shape, an island shape, etc. The second electrode 14 may electrically connect the selection element layer 13 with the second variable resistance layer 15 while separating them physically. If the second electrode 14 is not employed in the memory cell, i.e., the second electrode 14 is omitted, the selection element layer 13 may be in direct contact with the second variable resistance layer 15.

The first variable resistance layer 12 may have a characteristic which switches between different resistance states according to a voltage or current supplied thereto, and this characteristic is exemplarily shown in FIG. 2A. FIG. 2A shows a current-voltage curve of only the first variable resistance layer 12. That is, FIG. 2A shows a current-voltage curve in a case that the selection element layer 13 and the second variable resistance layer 15 of FIG. 1 are omitted.

Referring to FIG. 2A, in an initial state, the first variable resistance layer 12 may be in a high resistance state HRS. When a voltage applied to the first variable resistance layer 12 reaches a certain positive voltage, a set operation set1, which is an operation that changes the first variable resistance layer 12 from the high resistance state HRS to a low resistance state LRS, may be performed. The voltage applied to the first variable resistance layer 12 during the set operation set1 may be referred to as a first set voltage Vset1.

After the set operation set1 is completed, although the voltage applied to the first variable resistance layer 12 decreases, the low resistance state LRS of the first variable resistance layer 12 may be maintained until the voltage reaches a certain negative voltage. When the voltage applied to the first variable resistance layer 12 reaches the certain negative voltage, a reset operation reset1, which is an operation that changes the first variable resistance layer 12 from the low resistance state LRS to the high resistance state HRS, may be performed. The voltage applied to the first variable resistance layer 12 during the reset operation reset1 may be referred to as a first reset voltage Vreset1.

Although the voltage applied to the first variable resistance layer 12 increases again after the voltage applied to the first variable resistance layer 12 reaches the certain negative voltage, i.e., the first reset voltage Vreset1, the high resistance state HRS of the first variable resistance layer 12 may be maintained until the voltage reaches the certain positive voltage, i.e., the first set voltage Vset1, and thus the set operation set1 is performed again.

As described above, the first variable resistance layer 12 may repeatedly switch between the low resistance state LRS and the high resistance state HRS. That is, a plurality of set operations set1 and a plurality of reset operations reset1 may be performed on the first variable resistance layer 12 according to the applied voltage. Here, an initial set operation of the plurality of set operations set1 may be referred to as a forming operation. A forming voltage applied to the first variable resistance layer 12 during the forming operation may be substantially the same as or slightly higher than the first set voltage Vset1. Since the forming operation is one of the plurality of set operations set1, the forming operation and the forming voltage are not shown in FIG. 2. The first set voltage Vset1 except for the forming voltage may be substantially consistent during the plurality of set operations set1, and the first reset voltage Vreset1 may be substantially consistent during the plurality of reset operations reset1.

In this implementation, the first set voltage Vset1 is a positive voltage and the first reset voltage Vreset1 is a negative voltage, but other implementations are also possible. In another implementation, the first set voltage Vset1 may be a negative voltage and the first reset voltage Vreset1 may be a positive voltage. When a polarity of the first set voltage Vset1 is different from that of the first reset voltage Vreset1, the first variable resistance layer 12 may operate in a bipolar mode. Alternatively, when a polarity of the first set voltage Vset1 is the same as that of the first reset voltage Vreset1, the first variable resistance layer 12 may operate in a unipolar mode Here, a resistance state of the first variable resistance layer 12 may be changed in such a manner that a conductive filament F is locally generated in the first variable resistance layer 12 or disappears. That is, when the conductive filament F electrically connecting the first electrode 11 with the selection element layer 13 is generated in the first variable resistance layer 12, the first variable resistance layer 12 may have the low resistance state LRS. On the other hand, when the conductive filament F disappears, the first variable resistance layer 12 may have the high resistance state HRS.

The first variable resistance layer 12 may include an oxygen-deficient metal oxide containing a large amount of oxygen vacancies. The oxygen-deficient metal oxide may include a material that is deficient in oxygen compared to a material that satisfies a stoichiometric ratio. The oxygen-deficient metal oxide may include $TiO_x$, where x is smaller than 2, or $TaO_y$, where y is smaller than 2.5. In this case, the conductive filament F may be formed by movement of the oxygen vacancies. However, other implementations are also possible as long as the conductive filament F is locally formed in the first variable resistance layer 12.

The second variable resistance layer 15 may have a characteristic which switches between different resistance states according to a voltage or current supplied thereto, and this characteristic is exemplarily shown in FIG. 2B. FIG. 2B shows a current-voltage curve of only the second variable resistance layer 15. That is, FIG. 2B shows a current-voltage curve in a case that the selection element layer 13 and the first variable resistance layer 12 of FIG. 1 are omitted.

Referring to FIG. 2B, similar to the operation of the first variable resistance layer 12, a set operation set2 changing the second variable resistance layer 15 from a high resistance state HRS to a low resistance state LRS, and a reset operation reset2 changing the second variable resistance layer 15 from the low resistance state LRS to the high resistance state HRS, may be repeatedly performed. A voltage applied to the second variable resistance layer 15 during the set operation set2 may be referred to as a second set voltage Vset2, and a voltage applied to the second variable resistance layer 15 during the reset operation reset2 may be referred to as a second reset voltage Vreset2.

In this implementation, the second set voltage Vset2 is a positive voltage and the second reset voltage Vreset2 is a negative voltage, but other implementations are also possible. In another implementation, the second set voltage Vset2 may be a negative voltage and the second reset voltage Vreset2 may be a positive voltage. When a polarity of the second set voltage Vset2 is different from that of the second reset voltage Vreset2, the second variable resistance layer 15 may operate in a bipolar mode. Alternatively, when a polarity of the second set voltage Vset2 is the same as that of the second reset voltage Vreset2, the second variable resistance layer 15 may operate in a unipolar mode.

Here, an absolute value of the second set voltage Vset2 and/or an absolute value of the second reset voltage Vreset2 may be larger than an absolute value of the forming voltage of the first variable resistance layer 12. Therefore, in the memory cell 10, the set operation set2 and/or the reset operation reset2 of the second variable resistance layer 15 may not be performed during the forming operation of the first variable resistance layer 12. This will be described below in more detail.

Like the first variable resistance layer 12, a resistance state of the second variable resistance layer 15 may be changed in such a manner that a conductive filament is locally generated in the second variable resistance layer 15 or disappears. For example, the second variable resistance layer 15 may include an oxygen-deficient metal oxide. In an implementation, the first and second variable resistance layers 12 and 15 may include the same metal oxide. However, other implementations are also possible. The second variable resistance layer 15 may include one of various variable resistance materials that are used in an RRAM, a PRAM, an FRAM, an MRAM, etc. The variable resistance materials include a metal oxide such as a transition metal oxide, a perovskite-based material, a phase-change material such as a chalcogenide-based material, a ferroelectric material, a ferromagnetic material, etc.

The selection element layer 13 may control access to the second variable resistance layer 15. A characteristic of the selection element layer 13 is exemplarily shown in FIG. 2C. FIG. 2C shows a current-voltage curve of only the selection element layer 13. That is, FIG. 2C shows a current-voltage curve in a case wherein the first and second variable resistance layers 12 and 15 of FIG. 1 are omitted.

Referring to FIG. 2C, the selection element layer 13 may have a characteristic which can block or hardly allow a current flow therein at a voltage lower than a threshold voltage having a certain absolute value while allowing a rapid current flow at a voltage equal to or higher than the threshold voltage. That is, the selection element layer 13 may be turned on or turned off according to an absolute value of a voltage applied thereto. The threshold voltage may be referred to as a turn-on voltage Vt of the selection element layer 13.

Here, the absolute value of the turn-on voltage Vt of the selection element layer 13 may be larger than that of the forming voltage of the first variable resistance layer 12. Therefore, a turn-on operation of the selection element layer 13 may not be performed during the forming operation of the first variable resistance layer 12. This will be described below in more detail. Also, the absolute value of the turn-on voltage Vt of the selection element layer 13 may be smaller than that of the second set voltage Vset2 and/or that of the second reset voltage Vreset2. Therefore, the selection element layer 13 may be in a turn-on state during the set operation set2 and/or the reset operation reset2 of the second variable resistance layer 15.

The selection element layer 13 may have a diode structure. The selection element layer 13 may be formed of a material that switches between a conductive state and an insulation state by Joule heating induced by a voltage or current supplied thereto. The selection element layer 13 may include one or more of an OTS (Ovonic Threshold Switching) material such as a chalcogenide-based material, an MIEC (Mixed Ionic Electronic Conducting) material such as a chalcogenide-based material containing a metal, an MIT (Metal Insulator Transition) material such as $NbO_2$, $VO_2$, a tunneling insulation material, etc. However, other implementations are also possible as long as the selection element layer 13 is turned on or turned off according to the supplied voltage or current.

Meanwhile, FIGS. 2A, 2B and 2C show current-voltage characteristics of the first variable resistance layer 12, the second variable resistance layer 15 and the selection element layer 13, respectively. When the first variable resistance layer 12 and the second variable resistance layer 15 are electrically connected with each other as in the memory cell 10 of FIG. 1, the first variable resistance layer 12 and the second variable resistance layer 15 may show the current-voltage characteristics shown in FIG. 2D. In FIG. 2D, a thick solid line is a current-voltage curve of the first variable resistance layer 12, and a thin solid line is a current-voltage curve of the second variable resistance layer 15.

Referring to FIG. 2D, in an initial state, the first and second variable resistance layers 12 and 15 may be in a high resistance state HRS and the selection element layer 13 may be in a turn-off state. Then, when a voltage applied to the memory cell 10 reaches a forming voltage Vforming of the first variable resistance layer 12, a forming operation changing the first variable resistance layer 12 from the high resistance state HRS to a low resistance state LRS may be performed. At this time, the selection element layer 13 may still be in the turn-off state and the second variable resistance layer 15 may maintain the high resistance state HRS since an absolute value of a turn-on voltage of the selection element layer 13 and an absolute value of an operating voltage of the second variable resistance layer 15 are larger than an absolute value of the forming voltage Vforming of the first variable resistance layer 12. That is, the second variable resistance layer 15 and the selection element layer 13 may not perform any operation during the forming operation of the first variable resistance layer 12, and the forming operation of the first variable resistance layer 12 may be the first operation of the memory cell 10.

In the forming operation of the first variable resistance layer 12, a conductive filament F may be generated in the first variable resistance layer 12. One or more conductive filaments F may be generated in the first variable resistance layer 12.

Once the forming operation is performed so that the first variable resistance layer 12 has the low resistance state LRS, most of the magnitude of a voltage applied to the memory cell 10 may be applied to the selection element layer 13 and the second variable resistance layer 15. This is because the voltage applied to the memory cell 10 is distributed according to a resistance ratio of the first variable resistance layer 12, the selection element layer 13 and the second variable resistance layer 15. Therefore, the first variable resistance layer 12 may maintain its low resistance state LRS regardless of a voltage subsequently applied to the memory cell 100 to perform operations of the selection element layer 13 and/or the second variable resistance layer 15. That is, the conductive filament F generated in the first variable resistance layer 12 may remain. As a result, a voltage, which activates the reset operation reset1 of the first variable resistance layer 12, cannot be applied to the first variable resistance layer 12 anymore.

Then, when the voltage applied to the memory cell 10 increases and reaches the turn-on voltage of the selection element layer 13, the selection element layer 13 may be turned on. As a result, most of the voltage applied to the memory cell 10 may be applied to the second variable resistance layer 15. Therefore, the memory cell 10 may have a state in which the second variable resistance layer 15 operates. In this state, it is possible to perform a switching operation of the second variable resistance layer 15 by applying the second set voltage Vset2 or the second reset voltage Vreset2 to the second variable resistance layer 15.

Meanwhile, it is advantageous to generate and maintain the conductive filament F of the first variable resistance layer 12 when a density of oxygen vacancies included in the first variable resistance layer 12 is high and/or when a thickness of the first variable resistance layer 12 is small. In an implementation, when the first variable resistance layer 12 and the second variable resistance layer 15 are formed of a metal oxide, the density of the oxygen vacancies of the first variable resistance layer 12 may be higher than that of the second variable resistance layer 15. In another implementation, a first thickness T1 of the first variable resistance layer 12 may be smaller than a second thickness T2 of the second variable resistance layer 15.

The aforementioned memory cell 10 may have following advantages.

After the forming operation of the first variable resistance layer 12, the conductive filament F may remain in the first variable resistance layer 12. The conductive filament F may serve as an electrode that electrically connects the first electrode 11 with the selection element layer 13. That is, the first variable resistance layer 12 may not have a variable resistance characteristic during operations of the memory cell 10 except for the forming operation thereof, but may serve as an electrode that is locally formed in the first variable resistance layer 12 and in contact with the selection element layer 13. Here, since a width of the conductive filament F in a horizontal direction is very small, an area of the selection element layer 13, which is in contact with the conductive filament F, is also small. Therefore, when the selection element layer 13 is formed of a material which switches between a conductive state and an insulation state by Joule heating as described above, a heat loss of the selection element layer 13 may be significantly reduced. As a result, an operating power may be significantly reduced compared to a case that the selection element layer 13 is in direct contact with a whole surface of the first electrode 11.

Meanwhile, in the above implementation, a layer providing the conductive filament F is formed of a variable resistance material. Therefore, it is possible to reduce a stress applied to the selection element layer 13 because a forming operation of the variable resistance material in which the conductive filament F is generated is performed using a relatively low voltage.

However, other implementations are also possible, and an insulating layer (not shown) such as a silicon oxide, a silicon nitride, etc. may be used instead of the first variable resistance layer 12. When a high voltage, for example, a voltage higher than the forming voltage of the first variable resistance layer 12 is applied to the insulating layer, a dielectric breakdown may occur in the insulating layer to thereby form an irreversible conductive filament in the insulating layer. The irreversible conductive filament may serve as an electrode, which is coupled to the selection element layer 13, and may have a small width.

The memory cell 10 may be provided in plural. The plural memory cells 10 may be arranged in various manners to form a cell array. This will be exemplarily described with reference to FIG. 3.

Figure 3:
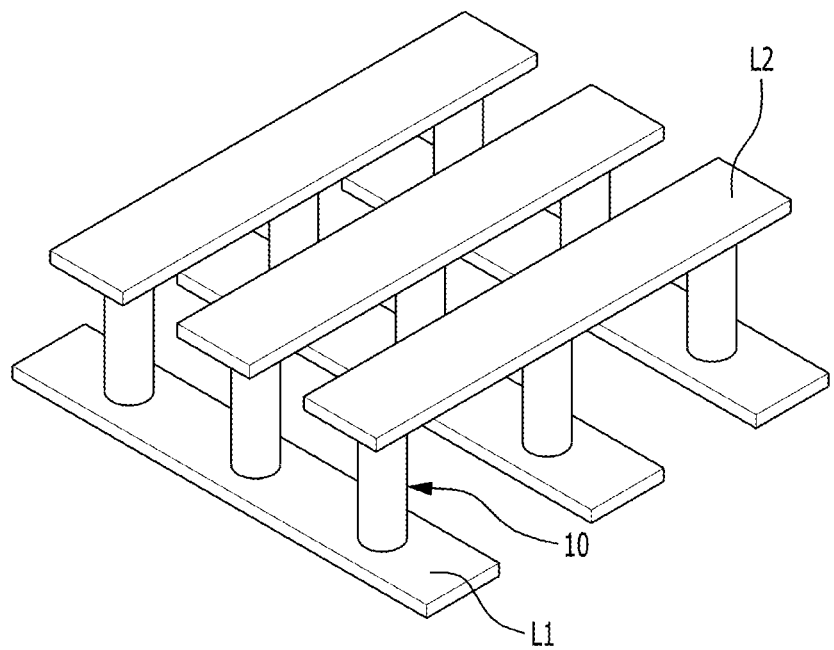
FIG. 3 is a perspective view illustrating a semiconductor device in accordance with an implementation.

FIG. 3 is a perspective view illustrating a semiconductor device in accordance with an implementation.

Referring to FIG. 3, the semiconductor device may include a plurality of first lines L1 formed over a substrate (not shown) and extending in a first direction, a plurality of second lines L2 formed over the first lines L1 and extending in a second direction crossing the first direction, and a plurality of memory cells 10 interposed between the first lines L1 and the second lines L2 and disposed at intersections of the first lines L1 and the second lines L2, respectively.

A voltage or current may be supplied to the memory cells 10 through the first lines L1 and the second lines L2. Each of the first lines L1 and the second lines L2 may have a single-layered structure or a multi-layered structure including one or more conductive material layers, e.g., a metal layer, a metal nitride layer, etc. The first lines L1 and the second lines L2 may be disposed in the reverse order. That is, the second lines L2 may be disposed over the first lines L1.

Each of the memory cells 10 may be substantially the same as the memory cell 10 of FIG. 1. That is, each of the memory cells 10 may include the selection element layer 13, the first variable resistance layer 12 or the insulating layer (not shown), and the second variable resistance layer 15. The first variable resistance layer 12 or the insulating layer (not shown) may be in direct contact with one end, e.g., a bottom surface, of the selection element layer 13 and includes the conductive filament F. The second variable resistance layer 15 is coupled to the other end, e.g., a top surface, of the selection element layer 13.

The second electrode 14 may be interposed between the selection element layer 13 and the second variable resistance layer 15. In an implementation, the first and third electrodes 11 and 16, which are located at both ends of the memory cell 10, may be omitted. In this case, the first lines L1 may perform a function of the first electrode 11 and the second lines L2 may perform a function of the third electrode 16.

The above and other memory circuits or semiconductor devices based on the disclosed technology can be used in a range of devices or systems. FIGS. 4-8 provide some examples of devices or systems that can implement a memory circuit in accordance with an embodiment disclosed herein.

Figure 4:
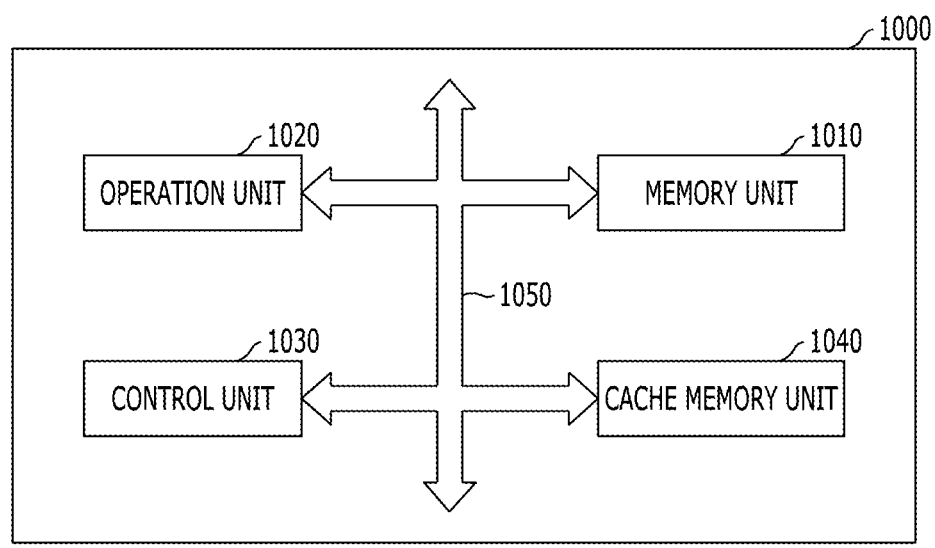
FIG. 4 illustrates a microprocessor implementing memory circuitry based on the disclosed technology.

FIG. 4 illustrates a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include a selection element layer; a material layer directly coupled to a first surface of the selection element layer and including a conductive filament; and a variable resistance layer coupled to a second surface of the selection element layer opposite to the first surface. Through this, an operating power of the memory unit 1010 may be reduced. As a consequence, an operating power of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
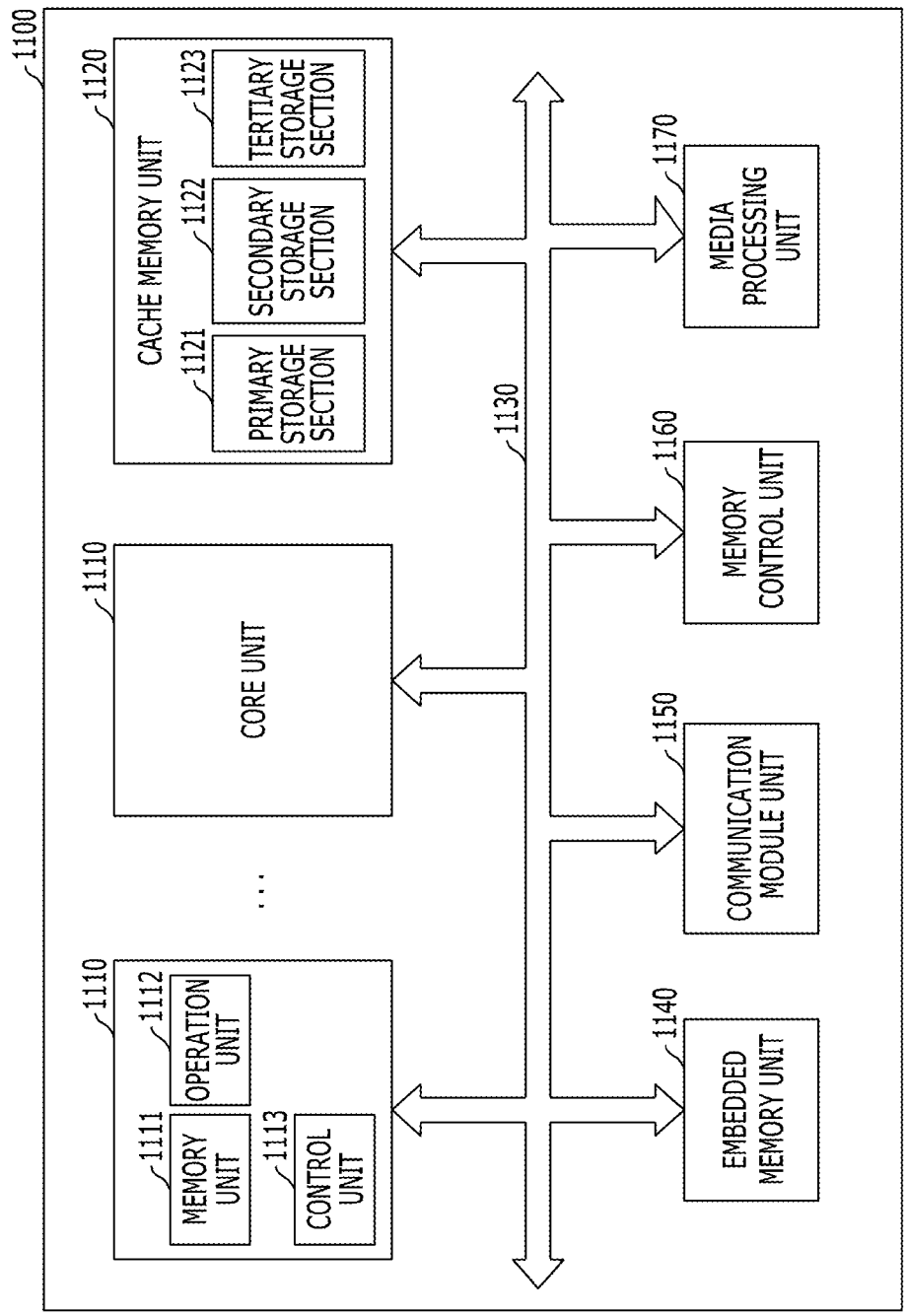
FIG. 5 illustrates a processor implementing memory circuitry based on the disclosed technology.

FIG. 5 illustrates a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a selection element layer; a material layer directly coupled to a first surface of the selection element layer and including a conductive filament; and a variable resistance layer coupled to a second surface of the selection element layer opposite to the first surface. Through this, an operating power of the cache memory unit 1120 may be reduced. As a consequence, an operating power of the processor 1100 may be reduced.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
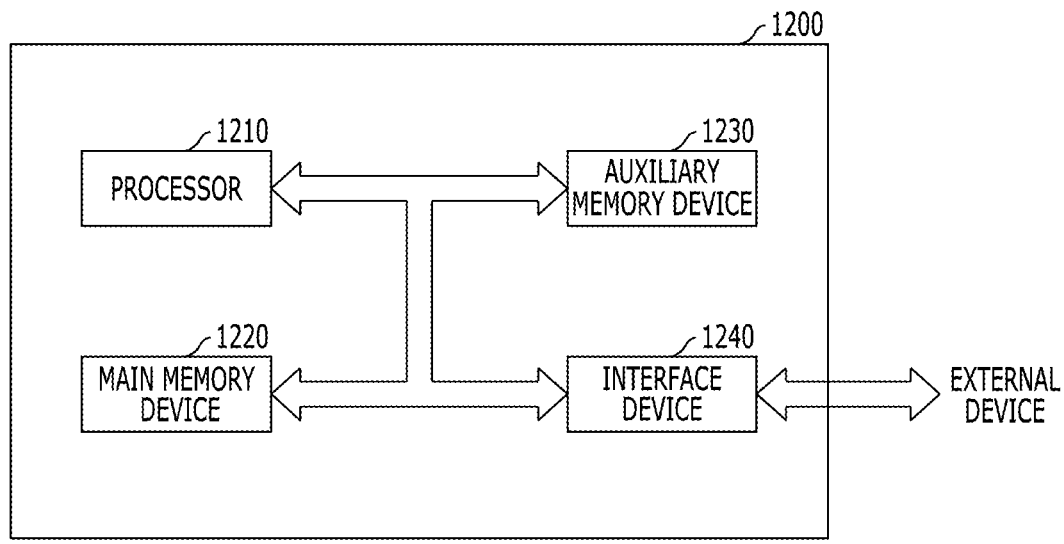
FIG. 6 illustrates a system implementing memory circuitry based on the disclosed technology.

FIG. 6 illustrates a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include a selection element layer; a material layer directly coupled to a first surface of the selection element layer and including a conductive filament; and a variable resistance layer coupled to a second surface of the selection element layer opposite to the first surface. Through this, an operating power of the main memory device 1220 may be reduced. As a consequence, an operating power of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include a selection element layer; a material layer directly coupled to a first surface of the selection element layer and including a conductive filament; and a variable resistance layer coupled to a second surface of the selection element layer opposite to the first surface. Through this, an operating power of the auxiliary memory device 1230 may be reduced. As a consequence, an operating power of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
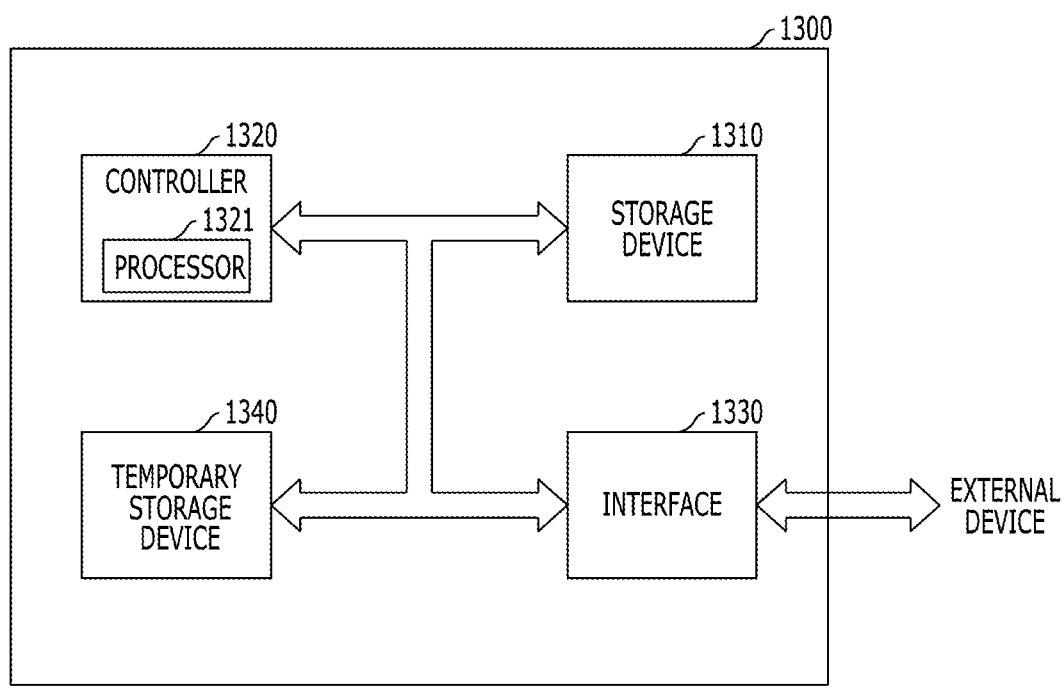
FIG. 7 illustrates a data storage system implementing memory circuitry based on the disclosed technology.
Figure 8:
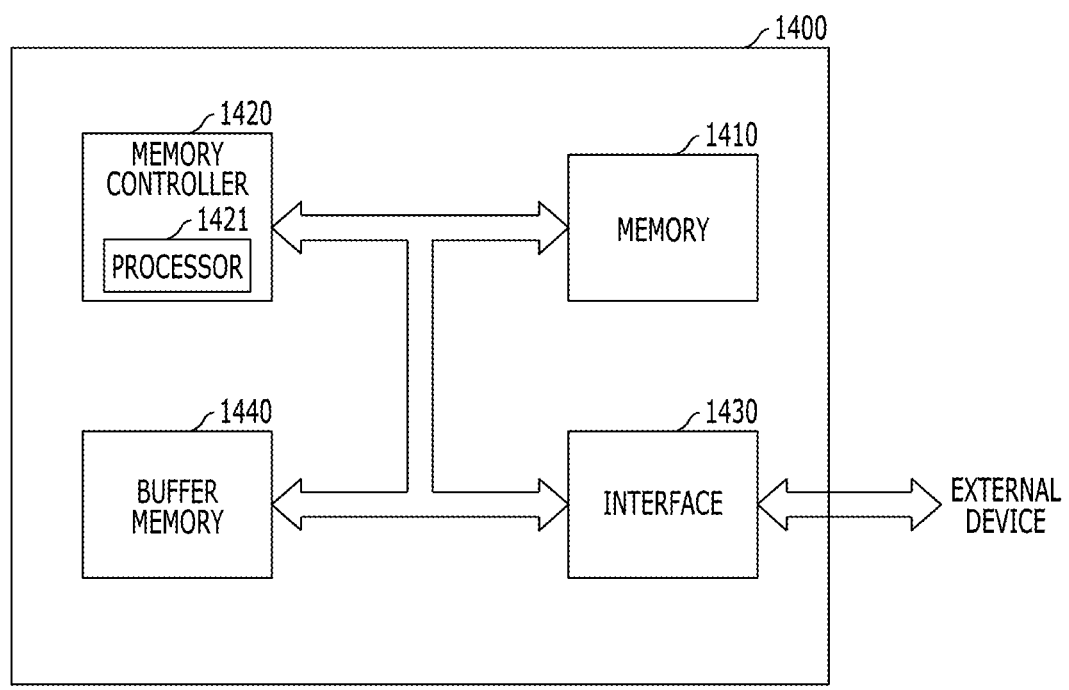
FIG. 8 illustrates a memory system implementing memory circuitry based on the disclosed technology.

FIG. 7 illustrates a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include a selection element layer; a material layer directly coupled to a first surface of the selection element layer and including a conductive filament; and a variable resistance layer coupled to a second surface of the selection element layer opposite to the first surface. Through this, an operating power of the temporary storage device 1340 may be reduced. As a consequence, an operating power of the data storage system 1300 may be reduced.

FIG. 9 illustrates a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include a selection element layer; a material layer directly coupled to a first surface of the selection element layer and including a conductive filament; and a variable resistance layer coupled to a second surface of the selection element layer opposite to the first surface. Through this, an operating power of the memory 1410 may be reduced. As a consequence, an operating power of the memory system 1400 may be reduced.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include a selection element layer; a material layer directly coupled to a first surface of the selection element layer and including a conductive filament; and a variable resistance layer coupled to a second surface of the selection element layer opposite to the first surface. Through this, an operating power of the buffer memory 1440 may be reduced. As a consequence, an operating power of the memory system 1400 may be reduced.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiments and examples are described. Other embodiments, enhancements and variations can be made based on what is described and illustrated in this disclosure.

What is claimed is:

1. An electronic device comprising a semiconductor memory unit, the semiconductor memory unit comprising:
    a stack structure including a selection element layer and a material layer which is directly coupled to a first surface of the selection element layer and includes a conductive filament; and
    a variable resistance layer coupled to the stack structure,
    wherein the variable resistance layer and the material layer include a metal oxide, and
    wherein a thickness of the variable resistance layer is larger than that of the material layer.

2. The electronic device according to claim 1, wherein the variable resistance layer is coupled to a second surface of the selection element layer opposite to the first surface.

3. The electronic device according to claim 1, wherein the material layer has a variable resistance characteristic.

4. The electronic device according to claim 3, wherein the metal oxide includes oxygen vacancies so that the conductive filament is generated depending on movement of the oxygen vacancies in the metal oxide.

5. An electronic device comprising a semiconductor memory unit, the semiconductor memory unit comprising:
    a stack structure including a selection element layer and a material layer which is directly coupled to a first surface of the selection element layer and includes a conductive filament; and
    a variable resistance layer coupled to the stack structure,
    wherein the variable resistance layer and the material layer include a metal oxide, and
    wherein a density of oxygen vacancies in the variable resistance layer is lower than that of the material layer.

6. The electronic device according to claim 1, wherein the material layer has an insulating characteristic.

7. The electronic device according to claim 6, wherein a part of the material layer is in a dielectric breakdown state so that the conductive filament is generated at the part of the material layer.

8. The electronic device according to claim 1, wherein the selection element layer switches between a conductive state and an insulation state depending on Joule heating induced by a voltage or current applied thereto.

9. The electronic device according to claim 1, wherein the conductive filament is generated in an initial operation of the semiconductor memory unit and remains in the material layer during operations of the selection element layer and the variable resistance layer that are performed after the initial operation.

10. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit is a part of the memory unit in the microprocessor.

11. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is a part of the cache memory unit in the processor.

12. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit is a part of the auxiliary memory device or the main memory device in the processing system.

13. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is a part of the storage device or the temporary storage device in the data storage system.

14. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit is a part of the memory or the buffer memory in the memory system.

15. An electronic device comprising a semiconductor memory unit, the semiconductor memory unit comprising:
a lower electrode;
a first variable resistance layer over the lower electrode;
a selection element layer over the first variable resistance layer;
a second variable resistance layer over the selection element layer; and
an upper electrode over the second variable resistance layer,
wherein the first variable resistance layer has a first set voltage to switch from a high resistance state to a low resistance state, and the second variable resistance layer has a second set voltage to switch from a high resistance state to a low resistance state, and
wherein an absolute value of the first set voltage is lower than an absolute value of the second set voltage.

16. The electronic device according to claim 15,
wherein the first variable resistance layer has a first reset voltage to switch from the low resistance state to the high resistance state, and the second variable resistance layer has a second reset voltage to switch from the low resistance state to the high resistance state, and
wherein an absolute value of the first reset voltage is lower than an absolute value of the second reset voltage.

17. The electronic device according to claim 16,
wherein the selection element layer is turned on at a turn-on voltage, and an absolute value of the turn-on voltage is greater than the absolute value of the first reset voltage.

18. The electronic device according to claim 17, wherein the absolute value of the turn-on voltage is lower than the absolute value of the second reset voltage.

19. The electronic device according to claim 15, wherein the selection element layer is turned on at a turn-on voltage, and an absolute value of the turn-on voltage is greater than the absolute value of the first set voltage.

20. The electronic device according to claim 19, wherein the absolute value of the turn-on voltage is lower than the absolute value of the second set voltage.

* * * * *